United States Patent
Chiang

(10) Patent No.: US 7,622,795 B2
(45) Date of Patent: Nov. 24, 2009

(54) LIGHT EMITTING DIODE PACKAGE

(75) Inventor: Cheng-Lien Chiang, Taipei (TW)

(73) Assignee: Nichepac Technology Inc., Taipei County (TW)

( * ) Notice: Subject to any disclaimer, the term of this patent is extended or adjusted under 35 U.S.C. 154(b) by 0 days.

(21) Appl. No.: 11/749,150

(22) Filed: May 15, 2007

(65) Prior Publication Data

US 2008/0285270 A1 Nov. 20, 2008

(51) Int. Cl.
*H01L 23/495* (2006.01)
(52) U.S. Cl. ............................ 257/675; 257/98; 257/99; 257/100
(58) Field of Classification Search ................. 257/675, 257/81, 82, 91, 98, 99, 100, 116, 117, 432–437, 257/E33.056–E33.059, 759; 438/25, 28
See application file for complete search history.

(56) References Cited

U.S. PATENT DOCUMENTS

| | | | | |
|---|---|---|---|---|
| 7,087,937 B2 * | 8/2006 | Liu | ............................... | 257/99 |
| 7,224,000 B2 * | 5/2007 | Aanegola et al. | .............. | 257/98 |
| 7,281,818 B2 * | 10/2007 | You et al. | .................... | 362/241 |
| 7,282,740 B2 * | 10/2007 | Chikugawa et al. | ........... | 257/79 |
| 7,361,940 B2 * | 4/2008 | Kim et al. | ..................... | 257/99 |
| 7,462,870 B2 * | 12/2008 | Nakashima | .................. | 257/81 |
| 2002/0113244 A1 * | 8/2002 | Barnett et al. | ................. | 257/98 |
| 2005/0145858 A1 * | 7/2005 | Loh | ............................ | 257/81 |
| 2005/0239227 A1 * | 10/2005 | Aanegola et al. | .............. | 438/26 |
| 2008/0258164 A1 * | 10/2008 | Masui et al. | .................. | 257/98 |

* cited by examiner

*Primary Examiner*—Dao H Nguyen
*Assistant Examiner*—Tram H Nguyen

(57) ABSTRACT

A substrate structure for light emitting diodes (LED) chips operation includes a heat spreader, chip holders arranged in the center of the heat spreader, transfer pads located near the chip holders for wire bonding interconnection between the LED chips, and a circuit layer having a gap dividing the circuit layer diagonally. The circuit layer includes a first insulation layer on top of the heat spreader, a metal trace layer on top of the first insulation layer, and a second insulation layer on top of the metal trace layer, wherein portions of the second insulation layer are removed at the opposite corners along the gap, and around the opening, and a conductive plating is plated on the second insulation layer around the opening. Furthermore, a spotlight cap is provided to focus the light emitted from the LED. A LED package includes the substrate structure and the spotlight cap is also provided.

4 Claims, 8 Drawing Sheets

LIGHT EMITTING DIODE PACKAGE

BACKGROUND

1. Field of Invention

The present invention relates to a substrate structure. More particularly, the present invention relates to a substrate structure for light emitting diode packages used in electronic devices.

2. Description of Related Art

In order for the light emitting diodes (LED) to be used in electronic devices, it is essential that the LED substrate have a high heat resistant property, wide light radiation angle, and ease of assembly. In prior attempts to achieve this goal, one has attempted in using a copper substrate divided into two isolated conductors by an insulation layer and mounting on the substrate layer is another insulation layer with circuit patterns providing an electrical path for the LED chip operation. Further more, the prior art design does not support multiple chips on a single substrate. Also, to assembly multiple substrates together while driving the LEDs with a single pair of power cables, the placement of power connectors are crucial to provide the shortest connection distance between the substrates.

Therefore, a new design of the LED substrate structure is needed for multiple chip placements on a single substrate while providing a high heat resistant property along with flexible assembly of multiple LED substrates.

SUMMARY

The present invention is directed to a circuit substrate, that is satisfies this need of a new substrate structure for LED chips operation. The substrate structure includes a heat spreader, chip holders, transfer pads, and a circuit layer. The chip holders are arranged in the center of the heat spreader. The transfer pads are located near the chip holders for wire bonding interconnection between the LED chips. The circuit layer having a gap dividing the circuit layer diagonally includes a first insulation layer on top of the heat spreader, a metal trace layer on top of the first insulation layer, and a second insulation layer on top of the metal trace layer. Portions of the second insulation layer are removed at the opposite corners along the gap, and around the opening, and a conductive plating is plated on the second insulation layer around the opening. The head spreader is a single sheet of metal having a rectangular shape. The gap in the circuit layer isolates the metal traces layers from the heat spreader and from each other. Since the metal trace layer is exposed at the opposite corners of the circuit layer, the multiple substrates may be joined by placing the substrates adjacent to each other and connecting the adjacent respective exposed metal trace layers together via conducting strips. In addition, a conductive adhesive is applied on the chip pad to connect and also elevate the LED chips above the circuit layer surface, thus preventing the thickness of the circuit layer to block any emitted light.

Furthermore, a spotlight cap is provided to focus the light emitted from the LED. The spotlight cap is fastened onto the substrate structure and has through holes for gel injection from the backside of the heat spreader. Combining the substrate structure with the spotlight cap, a LED package is provided having multiple LED chips such as in a 2×2 or 3×3 arrangement to be placed thereon. The LED packages may be connected into LED panels for use such as head and taillight for automobiles, or as searchlights. Also, the LED packages may be assembled into a general-purpose light bulb. The ease of assembly allows for many variations in the application of LED packages.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
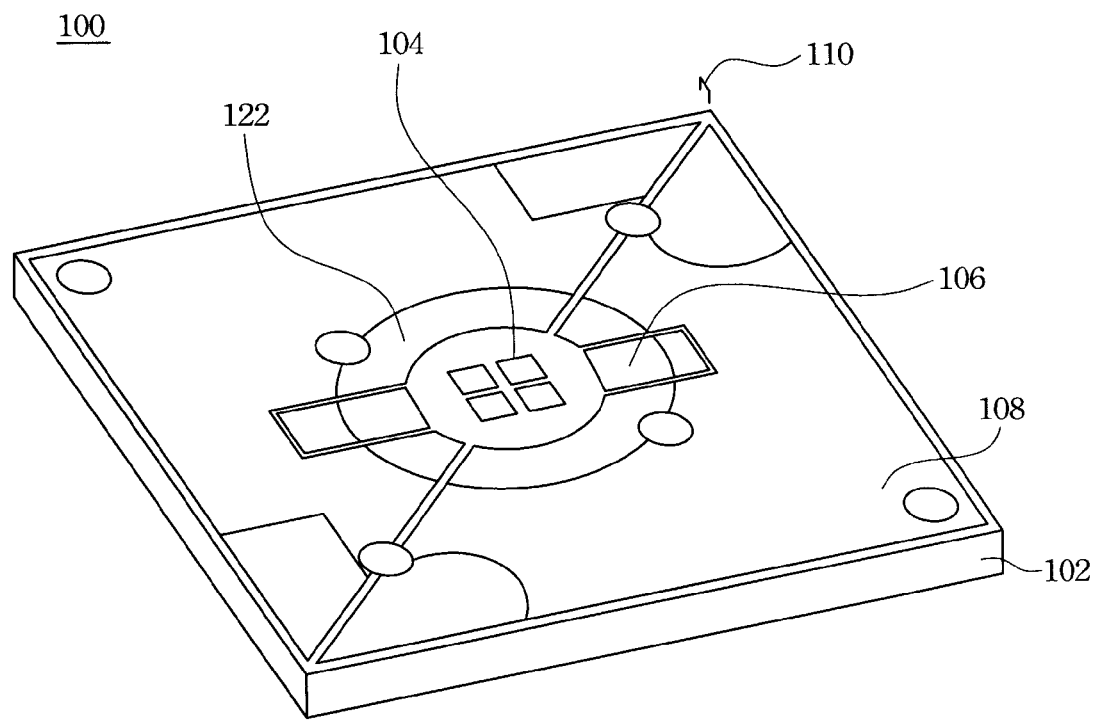
FIG. 1 is a general view of a substrate structure for LED chips operation according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Please refer to FIG. 1, a general view of a substrate structure for LED chips operation according to a first embodiment of the present invention. The substrate structure 100 includes a heat spreader 102, chip holders 104, transfer pads 106, and a circuit layer 108. The heat spreader 102 may be made of a good heat conductor such as copper. The chip holders 104 are arranged in the center of the substrate in array form such as a 2×2 array, a 3×3 array, a 4×4 array, etc. In this embodiment, it is a 2×2 array of chip holders 104. The chip holders 104 are for fixing the LED chips in place using a conductive adhesive, which has good thermal conductivity, such as a solder paste. In the embodiment, the thickness of the solder paste also allows the LED chips to be above the surface of the circuit layer, preventing the emitted light to be block by the opening side walls of the circuit layer 108. The chip holders 104 also may be made of a gold material. Next, the transfer pads 106 are for bond wire connection of the LED chips, and will be addressed more specifically later in the description. The transfer pads 106 are plated for bond wire engagement and the plating is isolated from the heat spreader 102 and the circuit layer 108. The circuit layer 108 mounted on the heat spreader 102 and is divided diagonally forming a gap 110 and an opening surrounding the chip holders 104. The forming of the gap 110 is to separate the circuit layers to form two independent voltage nodes in the substrate structure.

Figure 1A:
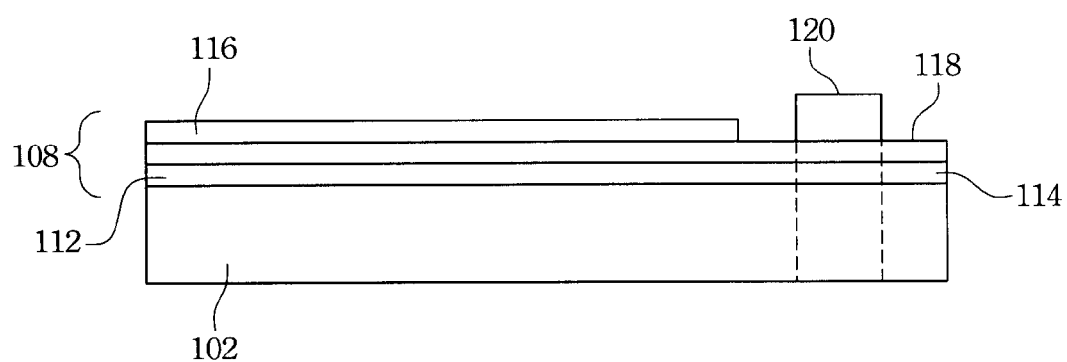
FIG. 1a is a side view of the substrate structure according to the first embodiment of the present invention.

In FIG. 1*a*, a partial side view of the substrate structure according to the first embodiment of the present invention, the circuit layer 108 includes a first insulation layer 112, a metal trace layer 114, and a second insulation layer 116. The first insulation layer 112 is directly on top of the heat spreader 102. The metal trace layer 114 is on top of the first insulation layer 112 and is isolated form the heat spreader 102. The metal trace layer 114 may have circuit patterns thereon. The second insulation layer 116 is mounted on top of the metal trace layer 114. The second insulation layer 116 is partially removed at the opposite corners along the dividing gap 110 of the circuit layer, thus exposing the metal trace layer 114 to allow contact access to the metal trace layer 114 at the corners of the circuit layer 108. Furthermore, the second insulation layer 116 is removed around the opening surrounding the chip pads 104, and the exposed metal trace layer 114 around the opening is plated by a conductive plating 122 such as gold. The conductive plating 122 is for the LED chips to be wire bonded thereon and be driven by the power supplied at the contact surface of the corners 118.

Figure 2:
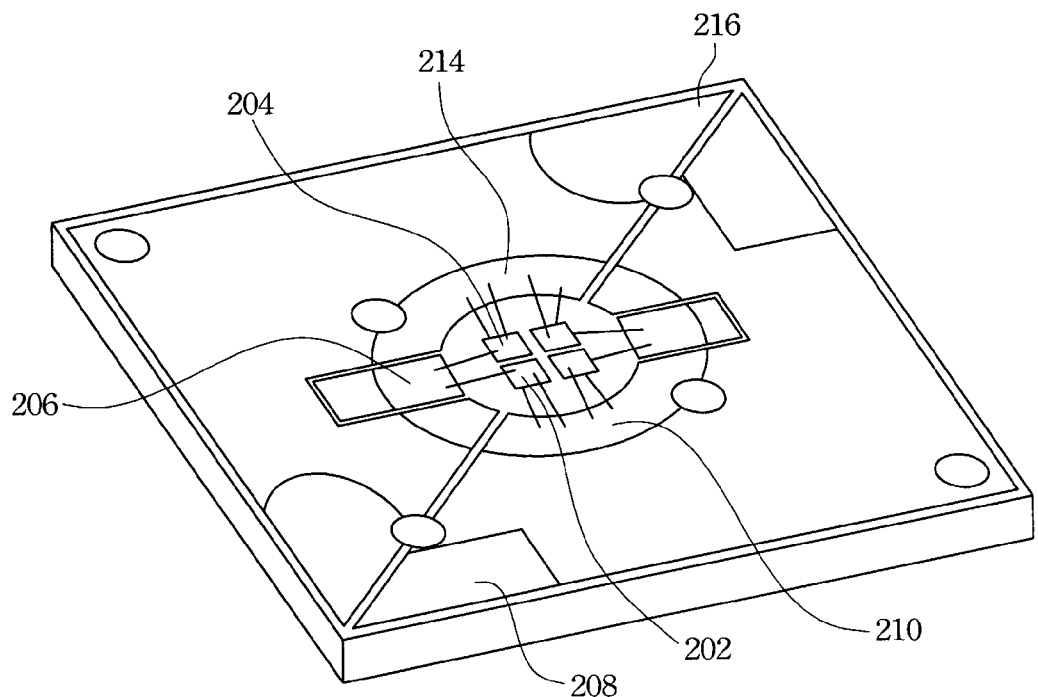
FIG. 2 is a general view of the substrate structure for LED chips operation with wire bonding chips thereon according to the first embodiment of the present invention.

Please refer to FIG. 2, a general view of the substrate structure for LED chips operation with wire bonding chips thereon according to the first embodiment of the present invention. The LED chip 202 is wire bonded to the conductive plating 208 around the opening of the circuit layer 108 for connecting the LED chip 202 to a power source. The LED chip 202 is also connected in series with the LED chip 204 via wire bonding with the transfer pad 206. The use of transfer pads are necessary due to the limitation of direct wire bonding between LED chips. A LED chip pad may not be able to sustain the force applied by wire-to-pad engagement, therefore necessary for the use of transfer pad 206. The LED chip 204 is wire bonded in the similar configuration. The LED chips 202 and 204 will be lit by the current flowing from the power supplied at the access interface 208 to the plating 210 around the opening of the circuit layer 108, to the LED chip 202, to the transfer pad 206, to the conductive plating 214, and finally to the access interface 216. Each row of the LED chips is arranged the same.

Figure 3:
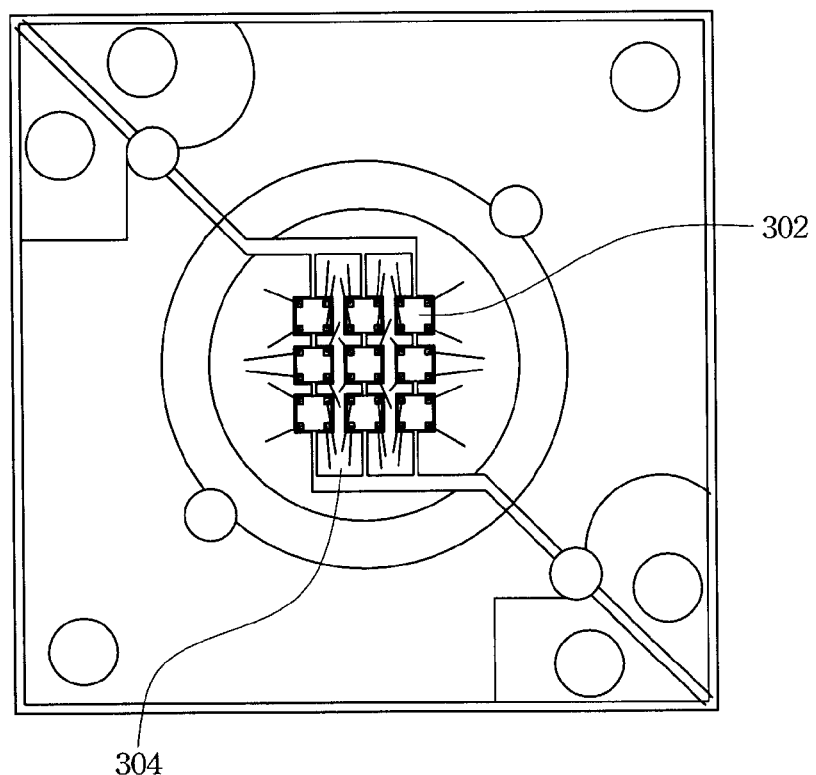
FIG. 3 is a top view of the substrate structure for LED chips operation with wire bonding chips thereon according to the first embodiment of the present invention.

Please refer to FIG. 3, a top view of the substrate structure for LED chips operation with wire bonding chips thereon according to the first embodiment of the present invention. In this example, a 3×3 array of LED chips 302 are mounted onto the substrate structure. Each row of the array is connected in series via transfer pads 304. The transfer pads 304 are located between the LED chips 302 to simplify the wiring complexity. This wire bonding via transfer pads configuration may be applied to further expansions such as a 4×4, 5×5 array of LED chips and so on.

Figure 4A:
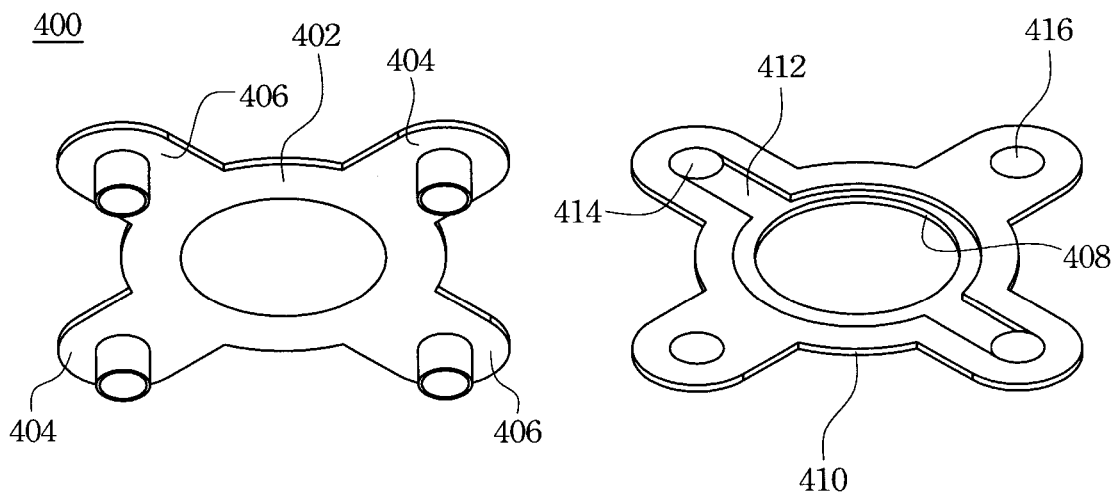
FIG. 4A is a top and bottom view the spotlight cup according to a second embodiment of the present invention.

Please refer to FIG. 4A, a top and bottom view the spotlight cup according to a second embodiment of the present invention. The spotlight cup 400 includes a body frame 402, a pair of fastening portions 404, and a pair of filling portions 406. The body frame 402 having a ring shape with an inner surface 408 and an outer surface 410. The inner surface 408 is slanted outwardly for a wider focus angle. The slanted inner surface 408 may also be of a curved surface. Extending in opposite directions from the outer surface 410 of the body from 402 are the fastening portions 404 and the filling portions 406. The fastening portions 404 are for fixing the spotlight cup 400 onto the substrate structure. The fastening portions 404 have fastening holes 416 thereon for fasteners insertion. The filling portions 406 are for containing gel injected from the backside of the substrate structure and shaped by a mold 412 formed on the body frame 402 and the filling portion 406. Filling holes 414 on the filling portions provide the entrance for the gel to be injected from the backside of the substrate structure.

Figure 4B:
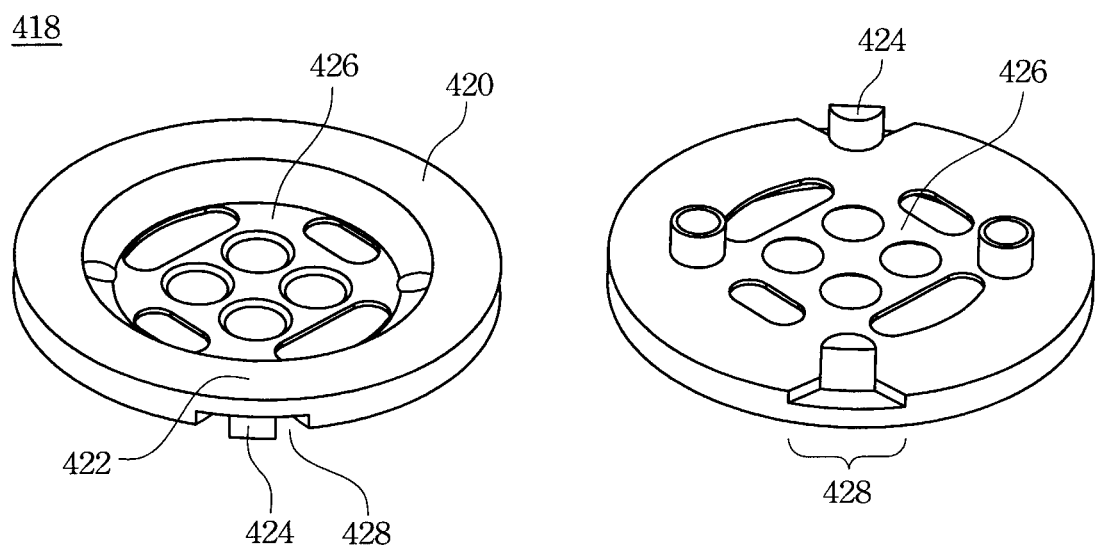
FIG. 4B is a top and bottom view of an alternately spotlight cup according to a third embodiment of the present invention.

As a third embodiment of the present invention, please refer to FIG. 4B, a top and bottom view of an alternately spotlight cup 418. The filling portion 420 and the fastening portions 422 are defined as extending the overall circumference of the spotlight cup 418 rather than defining finger-like portions such as fastening portions 404 and filling portions 406. Instead of having fastening holes such as fastenings holes 416 on the fastening portion 422, a cable opening 428 is designed to allow electric cables to pass through for connection with the access interfaces 208 and 216. Also, a plug portion 424 is extended from the fastening portion 422 for plugging the spotlight cup 416 into the substrate structure 100. Furthermore, the spotlight cup 416 according to the third embodiment of the present invention is design to improve the brightness of the LED chips on the substrate structure 100. In other words, to maximize the visibility of light emitted from the LED chips. Therefore, a cover plate 426 is designed to cover the center of the substrate structure 100. How the cover plate 426 achieves this purpose is discussed more extensively in the later description of the LED circuit module.

Figure 5A:
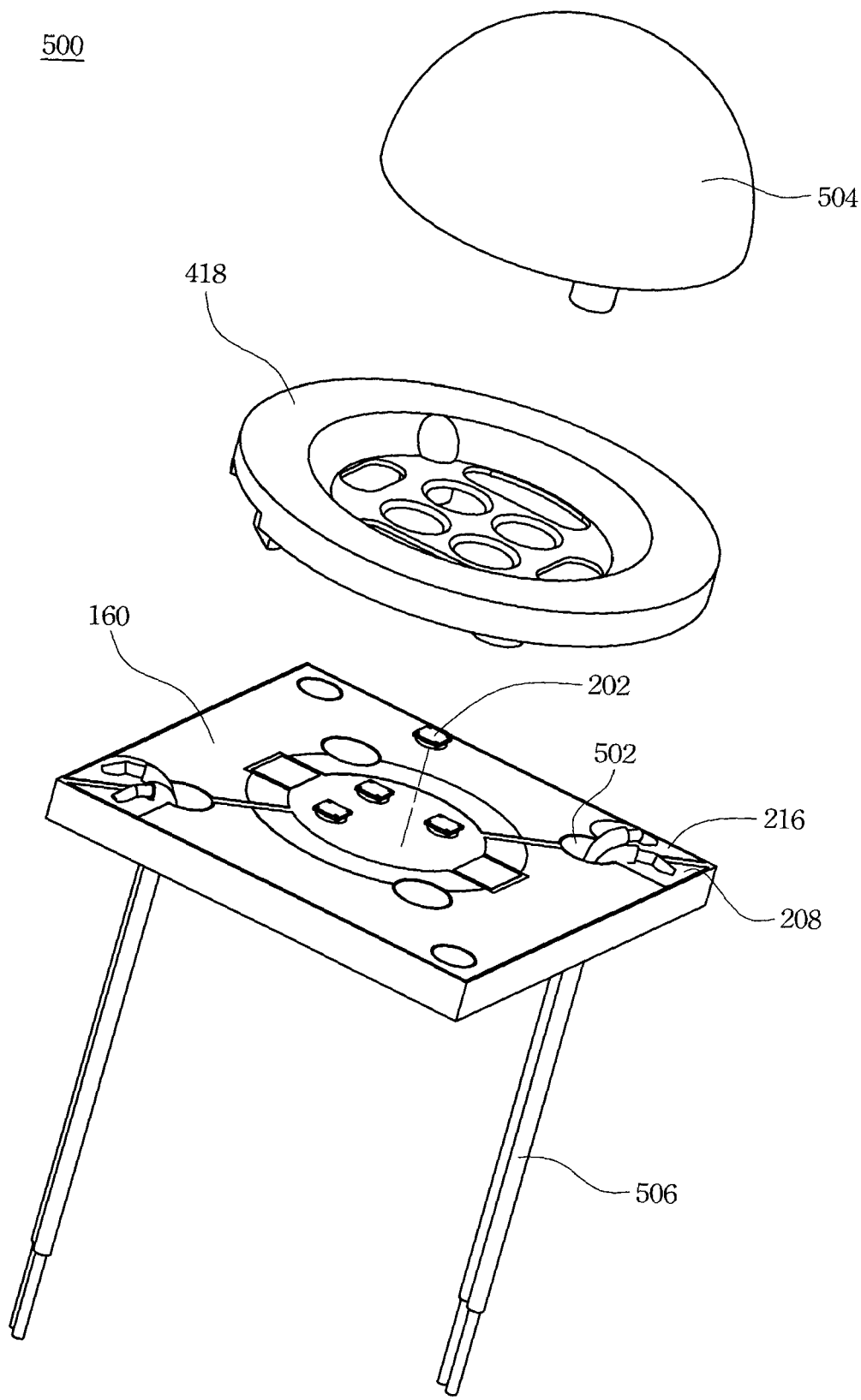
FIG. 5A is an exploded view of a LED circuit package according to a fourth embodiment of the present invention.

Please refer to FIG. 5A, an exploded view of a LED circuit package according to a fourth embodiment of the present invention. The LED circuit package 500 includes LED chips 202, a substrate structure 100, and a spotlight cup 418. The LED chips 202 are electrically connected to bond wires, respectively, for I/O access. In this embodiment, the LED chips 502 are arranged in a 2×2 arrangement, and may also be a 3×3 arrangement according to the first embodiment of the present invention. The spotlight cup 418 is fastened onto the substrate structure 100 via plug portions 424 plugging into the substrate holes 502. As mentioned above, gel is injected into the spotlight cup 416 from the backside of the substrate structure 100 and is contained by a gel cap 504. The gel cap 504 is designed to fit into the mold protecting the LED chips 202. In addition, electric cables 506 are inserted through the substrate holes 502 and connected to the access interfaces 208 and 216, respectively. The connection may be a solder connection. The other end of the electric cable 506 is connected to a power supply (not shown) to provide biasing voltages for lighting the LED chips 202.

Figure 5B:
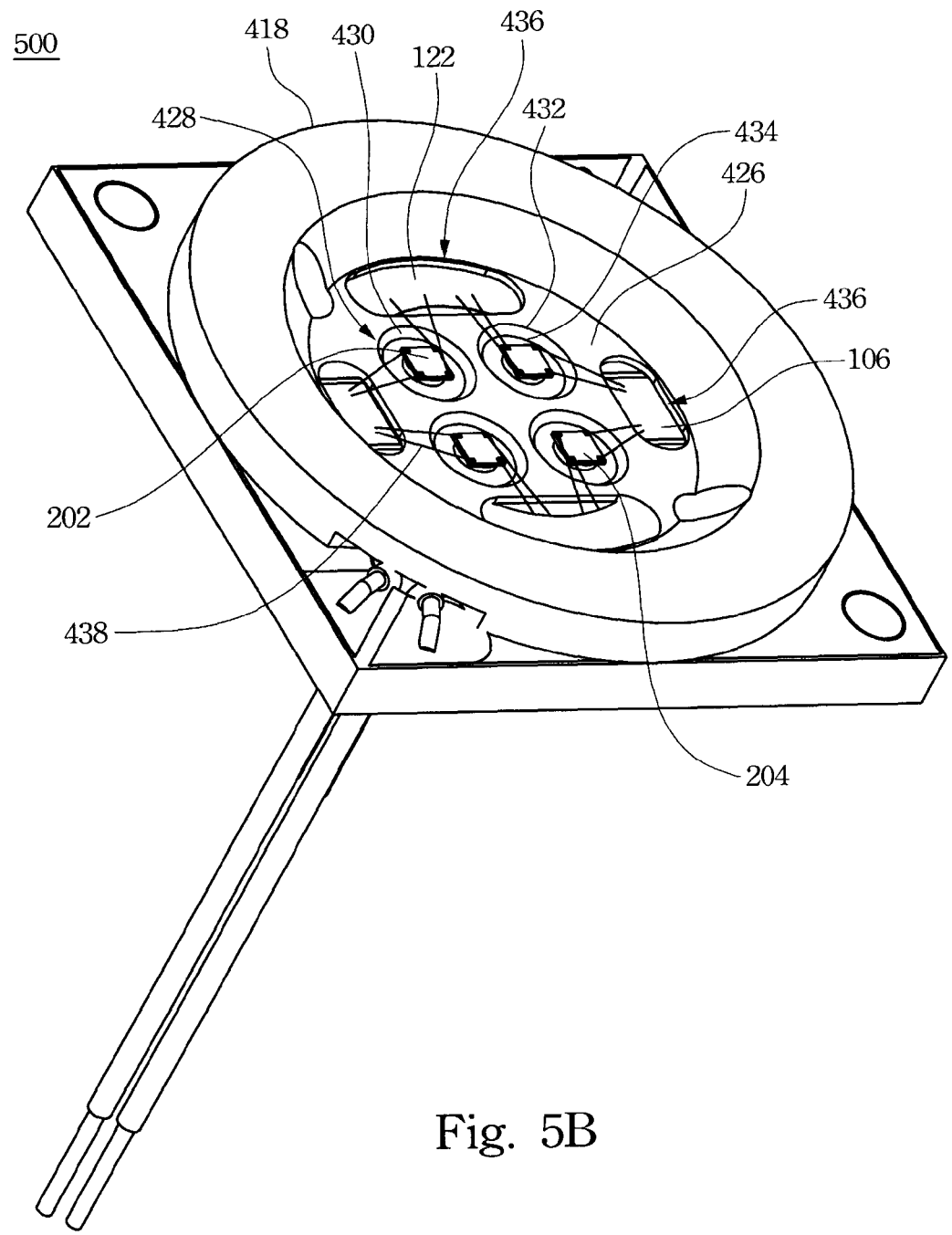
FIG. 5B is a general view of the LED circuit package according to the fourth embodiment of the present invention.

Please refer to FIG. 5B, a general view of the LED circuit package 500 according to the fourth embodiment of the present invention. In FIG. 5B, notice the cover plate 426 has circular openings 428 located to encompass individual LED chips such as LED chips 202 and 204. Each circular opening 428 has a secondary slanted inner surface 430. The circular openings 428 are wider at the top towards an upper edge 432, and narrower at the bottom towards a lower edge 434. The purpose of the slanted inner surface 430 is to reflect the light emitted by each individual LED chips out of the spotlight cup 418. Without the cover plate 426, the light emitted by the LED chips will be partially absorbed by other LED chips decreasing the overall brightness of the LED circuit package 500. Therefore, each secondary slanted inner face 430 ensures light emitted by each LED chip such as LED chip 202 is emitting out of the spotlight cup 413 to its full brightness.

Furthermore, in order for the inner surface 430 to properly reflect the light emitted by the LED chips such as LED chip 202, the vertical position of the LED chip 202 is to be lower than the upper edge 432 and higher than the lower edge 434 so that the horizontally emitted light from the LED chip 202 is reflected off the secondary slanted inner surface 430. The vertical position of the LED chip 202 may be adjusted by the thickness of the conductive adhesive cushioning the LED chip 202.

Lastly, the bond wires connecting the LED chips such as LED chips 202 and 204 may be as configured in FIG. 2, or may be wired over the cover plate 426 after the spotlight cup 416 is assembled onto the substrate structure 100 as illustrated in FIG. 5B. Therefore, the cover plate 426 further includes pad openings 436 for exposing the transfer pads 106 and the plating 122. The bond wires 438 are connected to the LED chip 202 and 204 at one end, and the bond wires 438 cross over the cover plate 426 and have the other end connect to the transfer pads 106 and the plating 122. In this case, the spotlight cup 416 is made of a non-conductive material or is coated with such material in order to prevent the bond wires from conducting with the spotlight cup 416. Regardless of whether the bond wires are under or above the cover plate, they are isolated by the gel injected into the spotlight cup 416.

Figure 6:
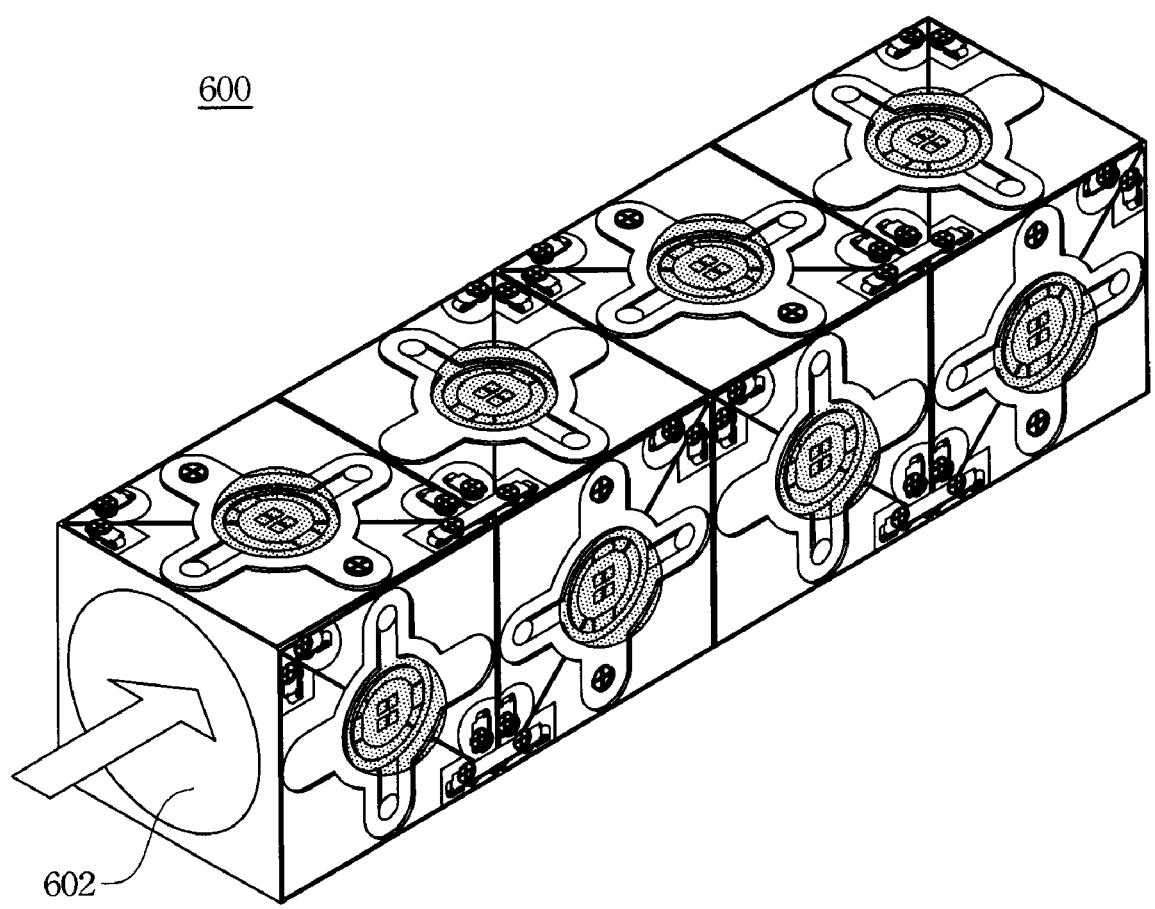
FIG. 6 is a 3-dimensional (3D) assembly of the LED circuit packages.

The connected packages may be applied to applications requiring stronger light emissions such as taillights and headlights of vehicles. Furthermore, referring to FIG. 6, a 3-dimensional (3D) assembly 600 of the LED circuit packages 500. The 3D assembly 600 may be used as lighting tubes such as lighting under water, wherein the hollow center of the 3D assembly may provide cooling channel 602 to the LED circuit packages 500. Water may flow through the cooling channel 602 to carry away the heat generated by the 3E assembly 600.

Figure 7A:
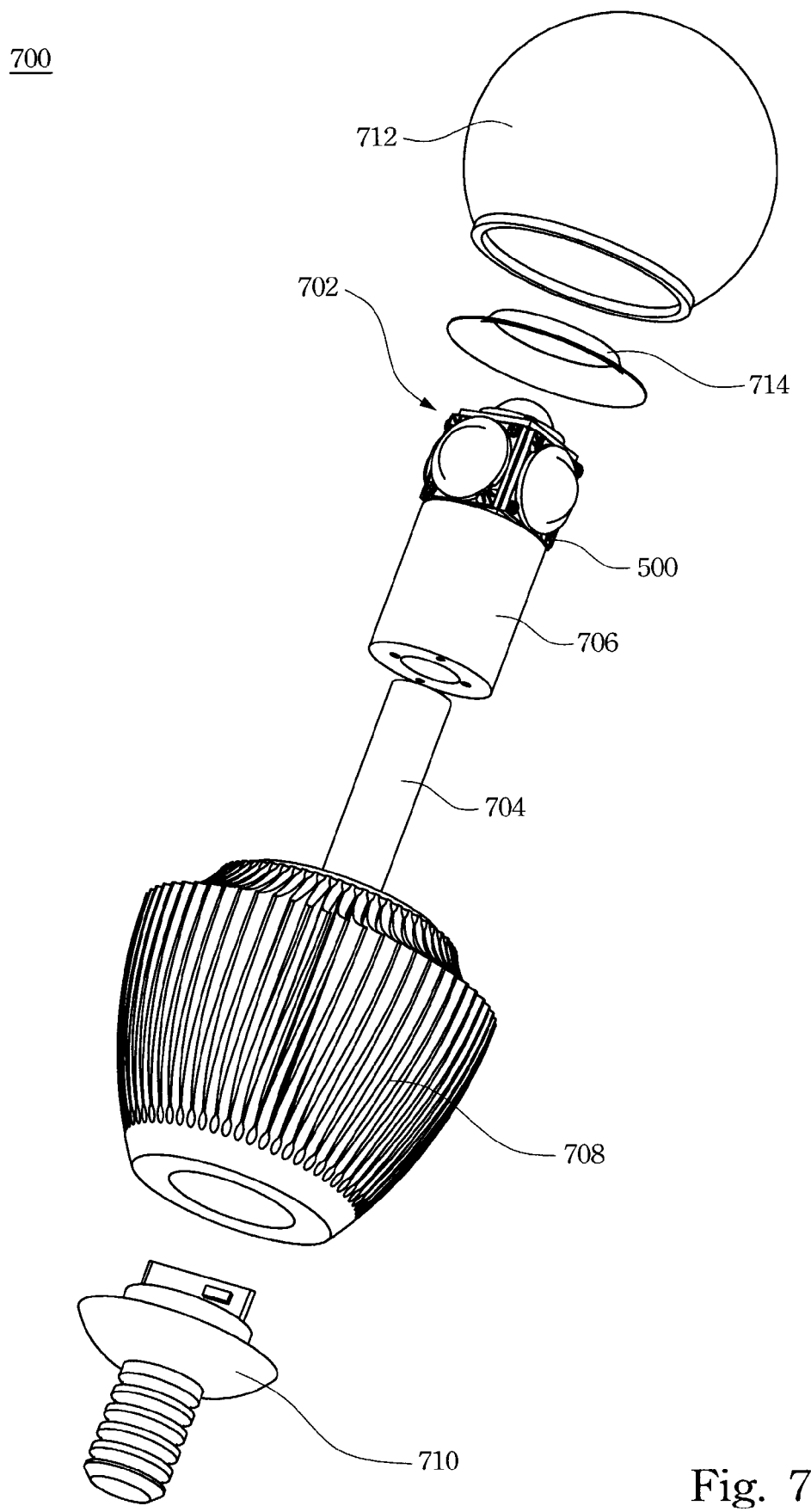
FIG. 7A is an exploded view of the general purpose light bulb.
Figure 7B:
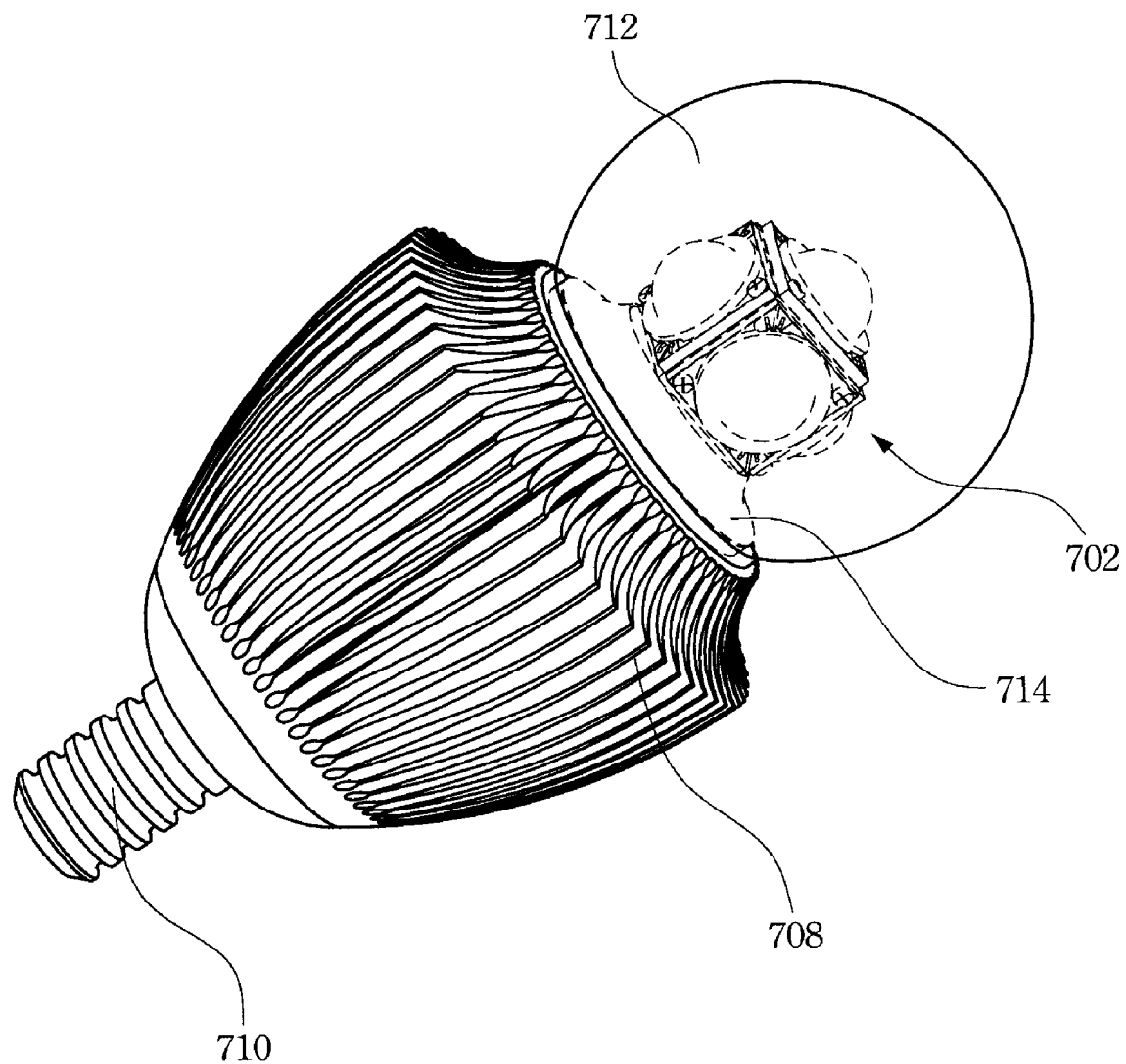
FIG. 7B is an assembled view of the general purpose light bulb.

In another application of the LED circuit package 500, the LED circuit packages 500 may be assembled into a general purpose light bulb 700 as illustrated in FIG. 7A and FIG. 7B. FIG. 7A is an exploded view of the general purpose light bulb 700. FIG. 7B is an assembled view of the general purpose light bulb 700. The LED circuit packages 500 form a cubic lighting core 702 with five light emitting surfaces. The lighting core 702 engages with a heat pipe 704, which is inserted into a heat conducting shaft 706. The heat conducting shaft 706 is then inserted into a cooling structure 708. Therefore, the thermal energy generated by the lighting core 702 is transferred from the substrate structure 100, to the heat pipe 704, then from the heat pipe 704 to the heat conducting shaft 706, and finally the thermal energy is released through the cooling structure 708. The general purpose light bulb 700 further includes a light bulb connector 710 connected to the electric cables (not shown) of the LED circuit packages 500, a lighting shield 712 to cover the lighting core 702 and a shield support 714 for positioning the lighting shield 710.

From the embodiments of the present invention, a new LED substrate structure is disclosed, which provides multiple LED chips to be assembled onto a single substrate. A spotlight cup is also disclosed to reflect the light emitted by the LED chips so that to maximize the visible brightness of the LED chips. Lastly, by integrating the substrate structure and the spotlight cup together, a new LED circuit package is disclosed, which multiple LED circuit packages may be connected and configure to new products such as taillights, underwater lighting devices, and general purpose light bulbs. Therefore, the LED circuit packages according to the embodiments of the present invention provides a flexible structure where the packages may be used as a light source wherever applicable. Also, with multiple LED chips on a single substrate structure, the brightness of the LED circuit package is significantly brighter than what is allowed in the prior art.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode circuit (LED) package, comprising:
    a plurality of LED chips electrically connected to bond wires, respectively, for I/O access;
    a substrate structure, comprising:
        a heat spreader;
        a plurality of chip holders for placing the LED chips thereon arranged in rows at the center of the heat spreader; and
        a circuit layer on top of the heat spreader, having a gap thereon dividing the circuit layer diagonally and an center opening encompassing the chip holders, for providing electrical paths for LED chips operation;
        substrate holes passing through the heat spreader and the circuit layer, for electric cables to insert through and connect with power supply;
        a plurality of transfer pads plated for bond wire engagement connecting each row of the LED chips in series, the transfer pads being isolated from the heat spreader and the circuit layer; and
    a spotlight cup, comprising:
        a body frame encompassing the LED chips;
        a pair of fastening portions extending outwardly from the body frame, and fastening to the substrate structure; and
        a pair of filling portions extending outwardly from the body frame, wherein the filling portions have holes through the substrate structure for gel injection.

2. The LED circuit package of claim 1, wherein the circuit layer further comprises a plurality of access interfaces for supplying a voltage to the LED chips.

3. The LED circuit package of claim 2, wherein the access interfaces are connected to the electric cables.

4. The LED circuit package of claim 3, wherein the connection is a solder connection.

* * * * *